(12) United States Patent
Edwards

(10) Patent No.: US 6,333,626 B1
(45) Date of Patent: Dec. 25, 2001

(54) FLOW METER FOR CONVERTING MECHANICAL ROTATION INTO AN ELECTRONIC SIGNAL

(75) Inventor: Paul K. Edwards, Norwich (GB)

(73) Assignee: Breed Automotive Technology, Inc., Lakeland, FL (US)

( * ) Notice: Subject to any disclaimer, the term of this patent is extended or adjusted under 35 U.S.C. 154(b) by 0 days.

(21) Appl. No.: 09/516,415

(22) Filed: Mar. 1, 2000

(30) Foreign Application Priority Data

Aug. 27, 1999 (GB) .................................................. 9920241

(51) Int. Cl.$^7$ .............................. G01R 1/02; G01F 15/00; G01D 5/245; G08B 13/02; G08B 13/22
(52) U.S. Cl. ..................... 324/110; 324/157; 324/207.13; 73/861.77; 377/21
(58) Field of Search ..................................... 324/110, 116, 324/142, 157, 207.13, 207.25, 156; 73/861.77, 861.08, 861.11; 340/637; 377/21; 702/45, 46

(56) References Cited

U.S. PATENT DOCUMENTS

| | | | |
|---|---|---|---|
| 4,200,785 | * | 4/1980 | Evans et al. ........................... 377/21 |
| 4,521,895 | * | 6/1985 | Wells ..................................... 377/21 |
| 4,910,519 | * | 3/1990 | Duell et al. ......................... 377/21 X |
| 6,012,339 | * | 1/2000 | Genack et al. .................... 73/861.77 |

FOREIGN PATENT DOCUMENTS

| | | | |
|---|---|---|---|
| 2101782 | * | 1/1983 | (GB) . |
| 2223593 | * | 4/1990 | (GB) . |
| 56-117120 | * | 9/1981 | (JP) . |

* cited by examiner

*Primary Examiner*—Gerard R. Strecker
(74) *Attorney, Agent, or Firm*—Lonnie Drayer; Patrick Stiennon

(57) ABSTRACT

A metering device has a magnet with ten poles which is driven to rotate by a gear connected to a source of rotation that is proportional to fluid flow, the passage of time, or other phenomena. A reed switch is mounted so that rotation of the poles of the magnet, into and out of a position adjacent to the reed switch causes the reed switch to open and close as the magnet rotates. The opening and closing of the reed switch causes a step change in voltage applied to an electronic device which increments a counter. A second reed switch spaced from the rotating magnet sufficiently so that it remains normally open can act as a sensitive device for detecting the presence of extraneous magnetic fields that might interfere with the operation of the first reed switch.

6 Claims, 1 Drawing Sheet

FLOW METER FOR CONVERTING MECHANICAL ROTATION INTO AN ELECTRONIC SIGNAL

FIELD OF THE INVENTION

The present invention relates to meters that convert mechanical rotation into an electronic signal.

BACKGROUND OF THE INVENTION

A large variety of meters are designed to measure a flow of fluid, such as water or gas, or measure a flow of electricity over time. Typically the flow is used to generate mechanical rotation which operates through a gear train to produce a dial indication of total quantity. Examples are odometers, water meters, gas meters, electrical meters, hour meters, etc. These devices were largely developed before the advent of modern digital circuitry. Today many meters are read remotely, or by a digital computer or microprocessor. Thus an hour meter on a piece of equipment may need to send a digital signal to a microprocessor which controls and monitors that equipment. Water meters for example can be read remotely, for example outside a building or home, to facilitate manual reading. A remote reading may also be accomplished over the phone or by radio or satellite linked to a central computer.

The ubiquitous nature of metering devices means cost, together with high reliability, is a prime consideration. A highly reliable mechanical switch generally means a reed switch, with its hermetically sealed contacts and life of up to one billion cycles without failure. Meter mechanisms have been modified to produce an electrical output by mounting a magnet on the mechanical output dial and detecting rotation of the magnet with a reed switch. Unfortunately, tampering with the meter is always a concern where the meter output is used to calculate a charge to a consumer.

What is needed is a way to convert a rotating dial output to a digital electrical signal which is of greater resolution and which can detect tampering.

SUMMARY OF THE INVENTION

The metering device of this invention employs a magnet with ten poles which is driven to rotate by a gear connected to a gear train which is connected to a source of rotation which is proportional to fluid flow, the passage of time, or other phenomena. A reed switch is mounted so that rotation of the poles of the magnet, into and out of a position adjacent to the reed switch, causes the reed switch to open and close as the magnet rotates. The opening and closing of the reed switch results in a step change in voltage applied to an electronic device which increments a counter. The result is a device that utilizes a reed switch to convert rotary motion into an electronic signal that can be easily transmitted to and processed by a computer.

Many metering devices are used to charge customers for the amount of some commodity consumed such as water, gas or electricity and so can provide a motivation for tampering. A second reed switch sufficiently spaced from the rotating magnet so that it remains normally closed can act as a sensitive device for detecting the presence of extraneous magnetic fields. Such extraneous magnetic fields can interfere with the operation of the first reed switch that acts to sense rotation of the multi-pole magnet.

The metering device may be designed for rapid human or robotic assembly. The components of the system for converting rotation into an electric signal comprise: a circuit board on which the rotation sensing reed switch and tamper sensing reed switch are mounted, together with resistors which are connected in series with the reed switches to limit the current flow through the circuit formed when the reed switch closes; a magnetic carrier having a platter and a post extending from the platter; and a ten-pole magnetic disk which is positioned on the platter like a record on a record player. A gear train is connected between a flow sensor and the platter which carries the multi-pole magnet.

Opposed resilient plastic fingers extend upwardly from the platter through opposed slots and overlie the magnet to retain the magnetic disk. The magnet and the magnetic carrier can be simple injection molded parts. The circuit board may be manufactured in accordance with the highly automated processes that have been developed for printed circuit board manufacture. The individual parts are readily assembled by simple placement on a suitable housing which incorporates the drive gear train and an upper face through which the dial rotates to drive a dial indicator.

It is a feature of the present invention to provide a means for converting rotary motion into a digital signal.

It is a further feature of the present invention to provide a mechanism for utilizing a reed switch to detect rotary motion.

It is a still further feature of the present invention to provide a meter for measurement of fluid flow over time that can detect tampering.

It is another feature of the present invention to provide a meter for measurement of fluid flow with greater resolution.

Further features and advantages of the invention will be apparent from the following detailed description when taken in conjunction with the accompanying drawings.

DETAILED DESCRIPTION OF THE INVENTION

Figure 1:
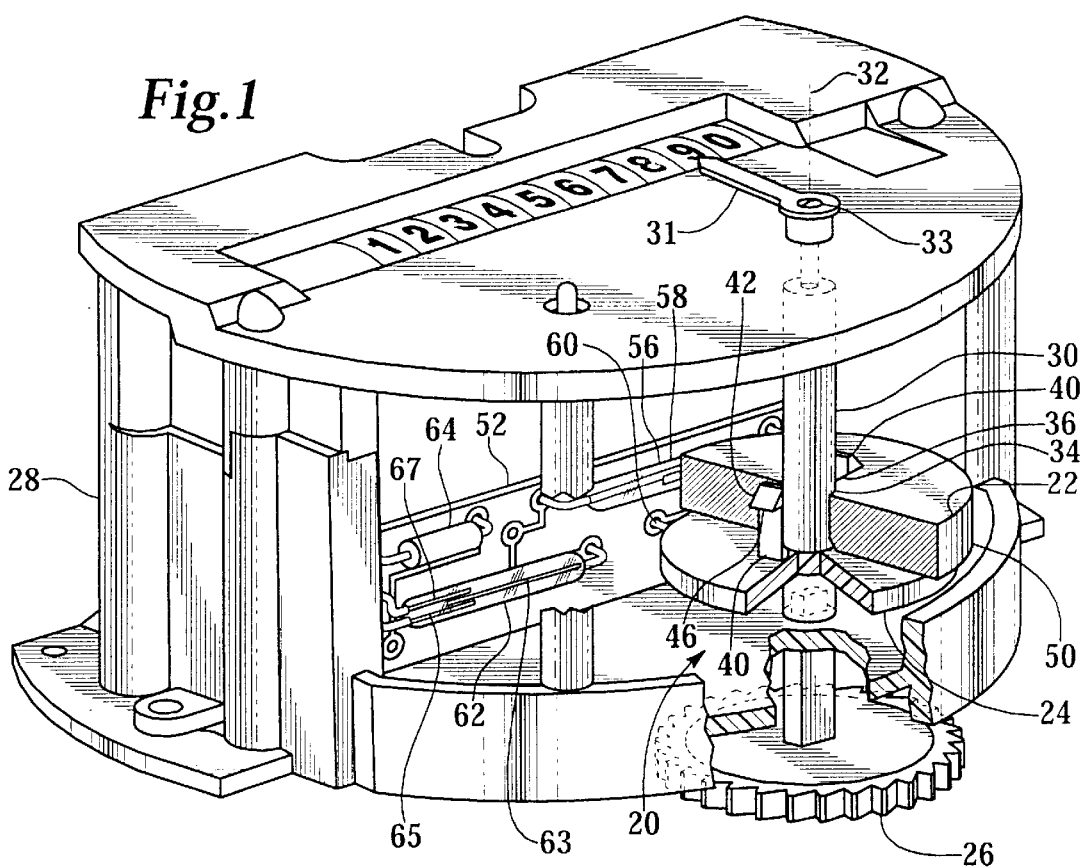
FIG. 1 is an isometric view of the components of this invention used to convert rotary motion to an electronic signal mounted on an application specific meter housing.
Figure 2:
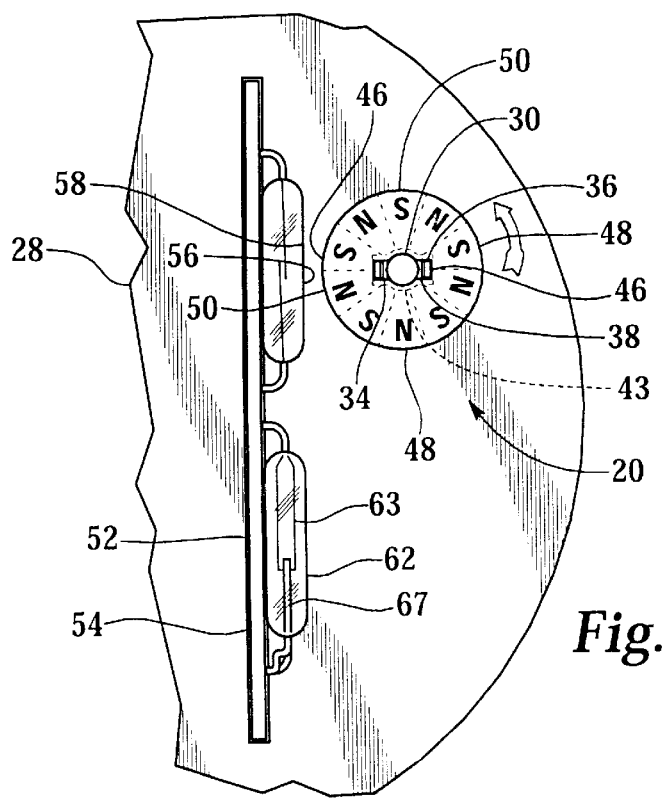
FIG. 2 is a top plan view of the circuit board and rotary magnet of the device of FIG. 1.

Referring to FIGS. 1 and 2, wherein like numbers refer to similar parts, an apparatus 20 for converting rotary motion to an electronic signal is shown. The components include a disk shaped magnet 22 that is mounted on a platter 24. The platter 24 is part of an assembly that is keyed to a gear 26 that is driven by a gear train (not shown). The platter 24 is mounted to a housing 28 for rotation about an axis 32. A post 30 extends upwardly from the platter 24 along the axis of rotation 32. A dial 31 may be affixed to the distal end 33 of the post to provide a visible indication of flow volume and flow rate. Such information may be useful in situations where a commodity like water is being measured, where the flow rate may have independent utility apart from metering quantity used.

It is desirable to mount the magnet 22 on the slowest moving portion of the gear train to minimize any effects of the inertia of the magnet. Further it is desirable to preserve as much of the characteristics of the existing mechanical meter as possible to preserve design experience and minimize cost.

As shown in FIG. 2, the magnet 22 has a central hole 34 and two rectangular openings 36 that extend from the hole 34 to form a single slotted hole 38. Two resilient fingers 40 extend upwardly of the platter 24. The resilient fingers 40 have inclined surfaces 42 that slope away from the axis of rotation 32. The inclined surfaces 42 cooperate with portions of the magnet 22 which form the rectangular openings 36 to bend the fingers 40 toward the central post 30, thereby allowing the magnet 22 to pass over the fingers 40. The fingers 40 have barbs 46 that fix the magnet 22 against rotation and translation with respect to the platter 24. The rectangular openings 36 may be provided with underside chamfers 43 to further aid in pressing the magnet down over the barbs 46 of the fingers 40.

The gear 26 is engaged by a gear train (not shown) which supplies rotary motion from a device such as an impeller which is caused to rotate by a flow of water, as in a water meter. The magnet 22 has ten magnetic poles 48 arranged around the periphery 50 of the magnetic disk 22. Rotation of the platter 24 causes the magnet to rotate about the axis of rotation 32.

A circuit board 52 is mounted to the housing 28 by portions 54 of the housing 28 which form a slot which fixedly positions the circuit board 52 with respect to the magnet 22 and platter 24. The circuit board consists of a first reed switch 56 that is positioned so the axis of the reed switch 56 is substantially tangent to and in the plane of the rotatable magnetic disk 22. Thus, rotation of the disk sequentially brings each magnetic pole 48 into a position adjacent the central activation region 58 of the reed switch 56. The glass capsule of the reed switch 56 is spaced 0.75 to 1.5 millimeters from the magnet.

Each pole of a magnet 22 induces an opposite pole in the reed switch providing the magnetic couple that causes the reed switch 56 to close. Between poles 48, the reed switch 56 opens, so the magnet 22 with ten poles results in ten openings, and ten closings of the reed switch. The reed switch 56 is configured and positioned so that for a constantly rotating magnet the reed switch is closed 60 percent of the time and open 40 percent of the time. This ratio of 60/40 between closed/open cycles facilitates the operation of the circuitry monitoring the rotation of the magnet 22. This ratio can be varied depending on the strength of the magnet and sensitivity of the reed switch.

A first resistor 60, which is connected in series with the first reed switch 56, is also mounted to the circuit board 52. The resistor 60 serves to limit the current flow through the first reed switch 56 and match the current flow to the counting circuitry (not shown). If reed switch current is limited, failure free performance of over one hundred million cycles is possible. If the magnetic disk 22 has a maximum rotation rate of 5.5 revolutions per minute, typical for a water meter, where each revolution represents one gallon of water, one hundred million cycles represents a life of 3.5 years at a maximum flow rate, or in a typical application many decades of use.

A second reed switch 62 of the so-called FORM C configuration is mounted to the circuit board 52 spaced from the magnet 22 so that it is not actuated by the rotation of the magnet 22. A FORM C reed switch has one movable reed 63 and two stationery reed contacts 65, 67. All three reeds are ferromagnetic, however the contact area of the first fixed reed 65, against which the movable reed 63 is biased, is formed of a nonmagnetic metal which has been welded to the ferromagnetic lead 65. When exposed to a magnetic field, both fixed reeds 65, 67 assume the same polarity, which is opposite that of the movable reed 63. Due to the nonmagnetic metal, which forms a flux interrupter, the only attractive force of sufficient magnitude is between the moveable reed 63 and the contact on normally open reed 67, so the moveable reed 63 transfers from the contact on the normally closed reed 65 to the contact on the normally open reed 67.

The FORM C reed switch 62 provides a positive indication of being present through the normally closed contact and provides a means of detecting an extraneous magnetic field through the normally open contact. Extraneous magnetic fields such as those caused by a magnet intentionally or accidentally positioned to interfere with the operation of the first reed switch 56 will cause a switch from the normally closed contact to the normally open contact. Because meters employing an apparatus 20 often are used to generate a usage charge based on the amount of a commodity metered, an indicator of tampering is critical.

A second resistor 64 is mounted in series with the normally closed reed 67 of the second reed switch 62 to again limit current flow to the circuitry detecting tampering (not shown). The second reed switch 62 is connected to a common ground and connects the circuitry detecting tampering through the second resistor 64 to the common ground (not shown). The first reed switch 56 is connected between the rotation detecting circuit (not shown) and the common ground so that when the first reed switch closes it connects the sensor rotation detecting circuit (not shown) to ground through the first resistor 60.

It should be understood that the housing arrangement and structure would depend on the particular meter into which the apparatus is incorporated. It should also be understood that the electronics that communicate with the circuit board may do so through wires soldered to the board or through a connector, interfaced directly with the board. Further wires soldered to the board may be led to connectors up mounted to the housing. Such housing connectors can then be connected to wires leading to a computer input circuitry or communication circuitry.

The gear train will determine the relationship between the measured flow and the rate of rotation of the disk. It will typically be chosen so the disk rotates at a rate that allows detection of minimum flow, and easy assessment of rate during maximum flow. For a typical water meter one rotation of an indicating dial will correspond to one gallon of water metered. Maximum flow rate will be limited to 5.5 U.S. gallons per minute (22 Liters per minute) minimum detectable flow rate will be one gallon every eight hours (one liter every two hrs.).

It should be understood that a gear may be incorporated into and integral with the platter and be driven by a gear forming part of a gear train.

It is understood that the invention is not limited to the particular construction and arrangement of parts herein illustrated and described, but embraces such modified forms thereof as come within the scope of the following claims.

I claim:

1. An apparatus for converting a rotary motion communicated from a gear train to a series of switch openings and closings which can be interpreted as digital bits, comprising:
   a housing;
   a platter mounted for rotation about an axis to the housing, the platter having a magnet receiving surface from which resilient fingers extend, and a gear engaging means mounted thereto;
   a post extending upwardly from the platter along the axis of rotation;
   a dial affixed to a distal end of the post, so as to rotate with the platter, to provide a visible indication of flow volume and flow rate;

a magnet mounted to the magnet receiving surface of the platter, the magnet having a multiplicity of poles arranged sequentially equally radially spaced about the axis of rotation, the rotation of the magnet defining a circular path along which the magnetic poles are sequentially arrayed, wherein the magnet is held positioned to the rotating platter by the resilient fingers which engage the magnet when it is pressed into engagement with the magnet receiving surface;

a circuit board mounted to portions of the housing which form a slot which fixedly positions the circuit board with respect to the magnet and platter;

a first reed switch having a first reed switch axis, the first reed switch being mounted to the circuit board and positioned so the first reed switch axis is closely spaced from the magnet and parallel to a tangent of the circular path defined by the magnet so that rotation of the magnet with the platter causes the first reed switch to open and close once for each of said multiplicity of poles for each complete rotation of the magnet;

a second reed switch mounted to the circuit board and closely spaced from the second reed switch but sufficiently spaced from the magnet so that rotation of the magnet does not cause the second reed switch to close, the second reed switch for detecting extraneous magnetic fields so as to detect tampering.

2. The apparatus of claim 1 wherein the second reed switch is of the type having a single movable reed and two stationery contacts, and wherein the moveable reed is biased against a first contact when an external magnetic field is not present.

3. The apparatus of claim 1 wherein the magnet has ten poles.

4. An apparatus for converting a rotary motion communicated from a gear train to a series of switch openings and closings which can be interpreted as digital bits, comprising:

a housing;

a platter mounted for rotation about an axis of rotation to the housing, the platter having a magnet receiving surface from which two resilient fingers extend;

a post extending upwardly from the platter along the axis of rotation;

a dial affixed to a distal end of the post, so as to rotate in fixed relation to the platter, to provide a visible indication of flow volume and flow rate;

a magnet mounted to the platter to co-rotate with the platter, the magnet having a multiplicity of poles arranged sequentially, the rotation of the magnet defining a path along which the magnetic poles are sequentially arrayed; the magnet having portions forming a central hole and two rectangular openings that extend from the hole to form a single slotted hole, wherein the two resilient fingers extend upwardly of the platter, the resilient fingers having inclined surfaces that slope away from the axis of rotation, the inclined surfaces cooperating with the rectangular openings to bend the fingers toward the central post, thereby allowing the magnet to pass over the fingers, wherein the fingers have barbs that fix the magnet against rotation and translation with respect to the platter;

a first reed switch mounted to the housing and positioned so the first reed switch is closely spaced from the magnet so that rotation of the magnet with the first member causes the first reed switch to open and close once for each of said multiplicity of poles for each complete rotation of the magnet;

a second reed switch mounted to the housing and closely spaced from the second reed switch but sufficiently spaced from the magnet so that rotation of the magnet does not cause the second reed switch to close the second reed switch for detecting extraneous magnetic fields so as to detect tampering.

5. The apparatus of claim 4 wherein the second reed switch is of the type having a single movable reed and two stationery contacts, and wherein the movable reed is biased against a first contact when an external magnetic field is not present.

6. The apparatus of claim 4 wherein the magnet has ten poles.

* * * * *